(12) United States Patent
Ishizawa et al.

(10) Patent No.: US 11,329,190 B2
(45) Date of Patent: May 10, 2022

(54) LIGHT EMITTING DEVICE AND PROJECTOR

(71) Applicants: Seiko Epson Corporation, Tokyo (JP); Sophia School Corporation, Tokyo (JP)

(72) Inventors: Shunsuke Ishizawa, Shinjuku (JP); Katsumi Kishino, Akiruno (JP)

(73) Assignees: Seiko Epson Corporation; Sophia School Corporation

( * ) Notice: Subject to any disclaimer, the term of this patent is extended or adjusted under 35 U.S.C. 154(b) by 84 days.

(21) Appl. No.: 16/829,032

(22) Filed: Mar. 25, 2020

(65) Prior Publication Data

US 2020/0313038 A1 Oct. 1, 2020

(30) Foreign Application Priority Data

Mar. 26, 2019 (JP) .............................. JP2019-059109

(51) Int. Cl.
*H01L 33/06* (2010.01)
*H01L 33/46* (2010.01)
(Continued)

(52) U.S. Cl.
CPC .......... *H01L 33/06* (2013.01); *G03B 21/2033* (2013.01); *H01L 33/08* (2013.01);
(Continued)

(58) Field of Classification Search
CPC ....................................................... H01L 33/08
See application file for complete search history.

(56) References Cited

U.S. PATENT DOCUMENTS

2004/0245438 A1* 12/2004 Payne .................. G06F 3/0412
250/221
2011/0169025 A1 7/2011 Kishino et al.
(Continued)

FOREIGN PATENT DOCUMENTS

JP 2007-123398 A 5/2007
JP 2018-142660 A 9/2018
(Continued)

OTHER PUBLICATIONS

K. Kuruma et al., "Position dependent optical coupling between single quantum dots and photonic crystal nanocavities", Appl. Phys. Lett. 109, pp. 071110-1-171110-5 (2016).
(Continued)

*Primary Examiner* — Moin M Rahman
*Assistant Examiner* — Mohammad A Rahman
(74) *Attorney, Agent, or Firm* — Harness, Dickey & Pierce, P.L.C.

(57) ABSTRACT

There is provided a light emitting device including: a substrate; and a laminated structure provided on the substrate and having a plurality of columnar portion groups, in which the columnar portion group includes at least one first columnar portion, and a plurality of second columnar portions, the first columnar portion has a light emitting layer into which a current is injected to generate light, no current is injected into the second columnar portion, an optical confinement mode is formed in the plurality of columnar portion groups, the first columnar portion is disposed at a
(Continued)

position that overlaps a peak of electric field intensity, and the second columnar portion is disposed at a position that does not overlap the peak of electric field intensity.

8 Claims, 8 Drawing Sheets

(51) Int. Cl.
    *H01L 33/08*     (2010.01)
    *H01L 33/30*     (2010.01)
    *H01L 33/18*     (2010.01)
    *H01L 33/24*     (2010.01)
    *G03B 21/20*     (2006.01)

(52) U.S. Cl.
    CPC .............. *H01L 33/18* (2013.01); *H01L 33/24* (2013.01); *H01L 33/30* (2013.01); *H01L 33/46* (2013.01); *H01L 2933/0016* (2013.01); *H01L 2933/0025* (2013.01)

(56) References Cited

U.S. PATENT DOCUMENTS

| | | |
|---|---|---|
| 2011/0204327 A1 | 8/2011 | Hiruma et al. |
| 2013/0002154 A1* | 1/2013 | Choi ............. H05B 45/60 315/185 R |
| 2016/0190392 A1 | 6/2016 | Kuraoka et al. |
| 2017/0221963 A1* | 8/2017 | Gardner .......... H01L 33/44 |
| 2019/0267526 A1* | 8/2019 | Kim .............. H01L 33/40 |

FOREIGN PATENT DOCUMENTS

| | | |
|---|---|---|
| WO | 2010-023921 A1 | 3/2010 |
| WO | 2010-044129 A1 | 4/2010 |
| WO | 2016-051908 A1 | 4/2016 |

OTHER PUBLICATIONS

Y. Kurisaki et al., "Theoretical investigation of nitride nanowire-based quantum-shell lasers", Phys. Status Solidi A 214, No. 8, 1600867, 4 pages (2017).

* cited by examiner

LIGHT EMITTING DEVICE AND PROJECTOR

The present application is based on, and claims priority from JP Application Serial Number 2019-059109, filed Mar. 26, 2019, the disclosure of which is hereby incorporated by reference herein in its entirety.

BACKGROUND

1. Technical Field

The present disclosure relates to a light emitting device and a projector.

2. Related Art

Semiconductor laser is expected as a next generation light source with high brightness. In particular, semiconductor laser having a nanostructure called nanocolumn, nanowire, nanorod, nanopillar, and the like is expected to be realized by a light emitting device capable of obtaining high-power light emission at a narrow radiation angle by the effect of a photonic crystal.

For example, International Publication No. 2010/023921 discloses a semiconductor optical element array including: a semiconductor substrate having a main surface on which a plurality of recess portions are formed; a mask pattern having a plurality of opening portions; a plurality of micro columnar crystals grown from the plurality of recess portions through the plurality of opening portions; and an active layer grown on each of the plurality of micro columnar crystals.

Similar to a general semiconductor laser, in the light emitting device having the nanostructure, a lasing threshold value is required to be reduced.

SUMMARY

A light emitting device according to an aspect of the present disclosure includes: a substrate; and a laminated structure provided on the substrate and having a plurality of columnar portion groups, in which the columnar portion group includes at least one first columnar portion, and a plurality of second columnar portions, the first columnar portion has a light emitting layer into which a current is injected to generate light, no current is injected into the second columnar portion, an optical confinement mode is formed in the plurality of columnar portion groups, the first columnar portion is disposed at a position that overlaps a peak of electric field intensity, and the second columnar portion is disposed at a position that does not overlap the peak of electric field intensity.

In the light emitting device, a diameter of the second columnar portion may be smaller than a diameter of the first columnar portion.

In the light emitting device, the second columnar portion may include a part at which the diameter of the second columnar portion is equal to a width of a depletion layer region in a radial direction of the second columnar portion.

In the light emitting device, a height of the second columnar portion may be lower than a height of the first columnar portion.

In the light emitting device, the number of peaks of electric field intensity in the columnar portion group may be equal to the number of the first columnar portions.

In the light emitting device, the columnar portion group may include two first columnar portions and two second columnar portions.

In the light emitting device, the light emitting layer may have a first part and a second part, a band gap of the second part is larger than a band gap of the first part, and the first part is disposed at a position that overlaps the peak of the electric field intensity.

A projector according to another aspect of the present disclosure includes the light emitting device according to the aspect.

DESCRIPTION OF EXEMPLARY EMBODIMENTS

Hereinafter, appropriate embodiments of the present disclosure will be described in detail with reference to the drawings. The embodiments described below are not inappropriately limited to the contents of the present disclosure described in the appended claims. In addition, not all of the configurations described below are essential configuration requirements of the present disclosure.

1. First Embodiment

1.1. Light Emitting Device

Figure 1:
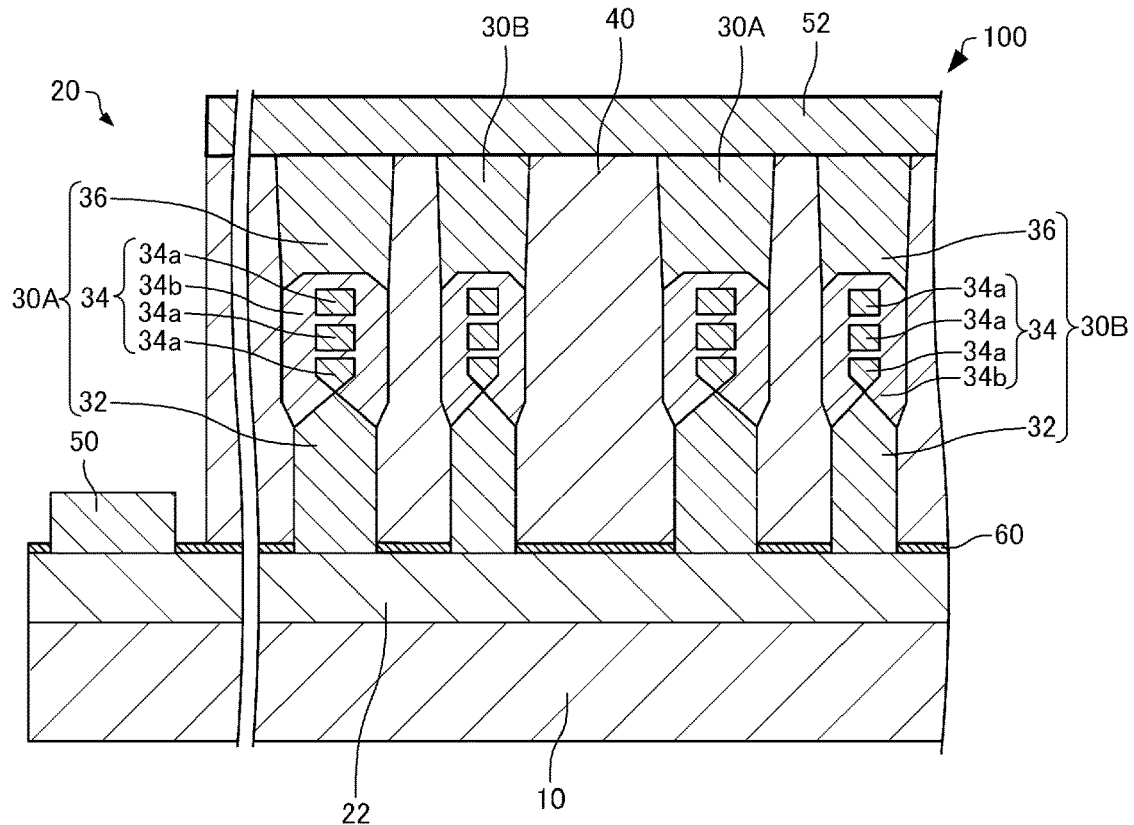
FIG. 1 is a sectional view schematically illustrating a light emitting device according to a first embodiment.
Figure 2:
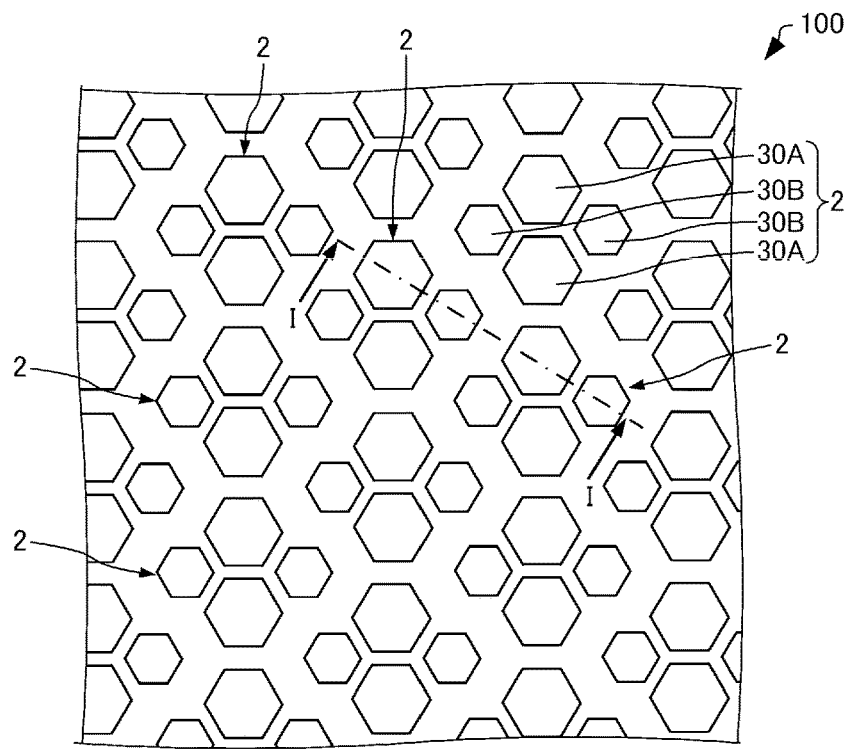
FIG. 2 is a plan view schematically illustrating the light emitting device according to the first embodiment.

First, a light emitting device according to a first embodiment will be described with reference to the drawings. FIG. 1 is a sectional view schematically illustrating a light emitting device 100 according to the first embodiment. FIG. 2 is a plan view schematically illustrating the light emitting device 100 according to the first embodiment. In addition, FIG. 1 is a sectional view taken along the line I-I in FIG. 2.

As illustrated in FIGS. 1 and 2, the light emitting device 100 includes a substrate 10, a laminated structure 20, a first electrode 50, and a second electrode 52. For convenience, in FIG. 2, illustration of members other than a first columnar portion 30A and a second columnar portion 30B of the laminated structure 20 is omitted.

The substrate 10 has, for example, a plate shape. The substrate 10 is, for example, a Si substrate, a GaN substrate, a sapphire substrate, or the like.

The laminated structure 20 is provided on the substrate 10. In the drawings, the laminated structure 20 is provided on the substrate 10. The laminated structure 20 includes, for example, a buffer layer 22, a plurality of first columnar portions 30A, a plurality of second columnar portions 30B, and a light propagation layer 40.

In addition, "upper" means a direction away from the substrate 10 when viewed from a multi quantum well (MQW) layer 34 in a lamination direction (hereinafter, also simply referred to as "lamination direction") of the laminated structure 20, and "lower" means a direction approaching the substrate 10 when viewed from the MQW layer 34 in the lamination direction. Further, the "lamination direction of the laminated structure 20" is a lamination direction of a first semiconductor layer 32 and the MQW layer 34.

The buffer layer 22 is provided on the substrate 10. The buffer layer 22 is, for example, an n-type GaN layer doped with silicon. On the buffer layer 22, a mask layer 60 for forming the first columnar portion 30A and the second columnar portion 30B is provided. The mask layer 60 is, for example, a titanium layer, a titanium oxide layer, a silicon oxide layer, an aluminum oxide layer, or the like.

The first columnar portion 30A and the second columnar portion 30B are provided on the buffer layer 22. The first columnar portion 30A and the second columnar portion 30B have a columnar shape that protrudes upward from the buffer layer 22. The first columnar portion 30A and the second columnar portion 30B are also called, for example, nanocolumns, nanowires, nanorods, and nanopillars. The size in the lamination direction of the first columnar portion 30A and the second columnar portion 30B is, for example, 0.1 μm or more and 5 μm or less.

The cross-sectional shape in the direction orthogonal to the lamination direction of the first columnar portion 30A and the second columnar portion 30B is, for example, a polygon or a circle. In the example illustrated in FIG. 2, the cross-sectional shapes of the first columnar portion 30A and the second columnar portion 30B are regular hexagons.

The first columnar portion 30A includes the first semiconductor layer 32, the MQW layer 34 that functions as a light emitting layer, and a second semiconductor layer 36.

The first semiconductor layer 32 is provided on the buffer layer 22. The first semiconductor layer 32 is provided between the substrate 10 and the MQW layer 34. The first semiconductor layer 32 is, for example, an n-type semiconductor layer. The first semiconductor layer 32 is, for example, an n-type GaN layer doped with Si, an n-type AlGaN layer doped with Si, or the like.

The MQW layer 34 is provided on the first semiconductor layer 32. The MQW layer 34 is provided between the first semiconductor layer 32 and the second semiconductor layer 36. In the first columnar portion 30A, the MQW layer 34 functions as a light emitting layer that generates light when a current is injected.

The MQW layer 34 has a first part 34a and a second part 34b. The first part 34a and the second part 34b are, for example, i-type InGaN layers that are not doped with impurities. The first part 34a is a part formed by aggregation of InGaN having a high In composition. In other words, the concentration of indium at the first part 34a is higher than the concentration of indium at the second part 34b. A band gap of the second part 34b is larger than a band gap of the first part 34a. The first part 34a is positioned at a center portion of the first columnar portion 30A. The second part 34b surrounds the first part 34a.

A plurality of first parts 34a are provided. The plurality of first parts 34a are arranged in the lamination direction. A second part 34b is provided between the adjacent first parts 34a. In the illustrated example, three first parts 34a are provided. The MQW layer 34 has a multiple quantum well structure including three first parts 34a and the second part 34b. In other words, the first part 34a functions as a quantum well layer, and the second part 34b functions as a barrier layer.

The second semiconductor layer 36 is provided on the MQW layer 34. The second semiconductor layer 36 is a layer having a conductivity type different from the first semiconductor layer 32. The second semiconductor layer 36 is, for example, a p-type semiconductor layer. The second semiconductor layer 36 is, for example, a p-type GaN layer doped with magnesium, a p-type AlGaN layer doped with magnesium, or the like. The first semiconductor layer 32 and the second semiconductor layer 36 are cladding layers having a function of confining light in the MQW layer 34.

The second columnar portion 30B has the same layer structure as the first columnar portion 30A. In other words, similar to the first columnar portion 30A, the second columnar portion 30B includes the first semiconductor layer 32, the MQW layer 34, and the second semiconductor layer 36.

A diameter of the second columnar portion 30B is smaller than a diameter of the first columnar portion 30A. Therefore, a resistance of the second columnar portion 30B is larger than a resistance of the first columnar portion 30A. For example, the minimum diameter of the second columnar portion 30B is smaller than the minimum diameter of the first columnar portion 30A. The diameter of the first columnar portion 30A is, for example, 50 nm or more and 150 nm or less. The diameter of the second columnar portion 30B is, for example, 10 nm or more and 80 nm or less.

The "diameter" is a diameter when the planar shape of the first columnar portion 30A is a circle, and a diameter of the smallest inclusive circle when a planar shape of the first columnar portion 30A is not a circle. For example, the diameter of the first columnar portion 30A is the minimum diameter of a circle including a polygon therein when the planar shape of the first columnar portion 30A is a polygon, and is the minimum diameter of the circle including an ellipse therein when the planar shape of the first columnar portion 30A is an ellipse. The same applies to the diameter of the second columnar portion 30B.

Figure 3:
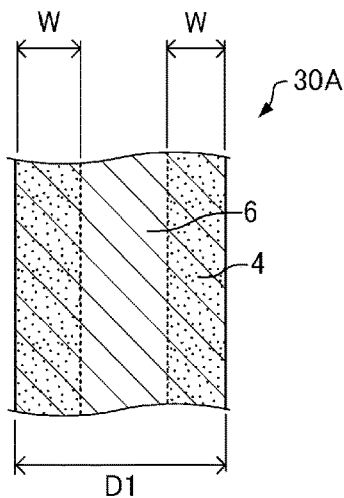
FIG. 3 is a view for describing a depletion layer region of a first columnar portion.
Figure 4:
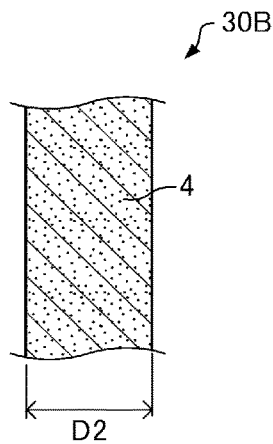
FIG. 4 is a view for describing a depletion layer region of a second columnar portion.

FIG. 3 is a view for describing a depletion layer region 4 of the first columnar portion 30A. FIG. 4 is a view for describing the depletion layer region 4 of the second columnar portion 30B. In addition, FIG. 3 illustrates a cross section including a minimum diameter part of the first columnar portion 30A, and FIG. 4 illustrates a cross section including a minimum diameter part of the second columnar portion 30B.

As illustrated in FIGS. 3 and 4, the first columnar portion 30A and the second columnar portion 30B have the depletion layer region 4. The depletion layer region 4 is a region where carriers are depleted by Fermi-level pinning in the vicinity of side surfaces of the first columnar portion 30A and the second columnar portion 30B.

As illustrated in FIG. 3, a part that configures a minimum diameter D1 of the first columnar portion 30A has a depletion layer region 4 and a non-depletion layer region 6 in which no depletion layer is formed. In other words, the minimum diameter D1 of the first columnar portion 30A is larger than a width (2×W) of the depletion layer region 4 in the radial direction of the first columnar portion 30A. Therefore, the non-depletion layer region 6 is formed in the center portion of the first columnar portion 30A.

As illustrated in FIG. 4, a part that configures a minimum diameter D2 of the second columnar portion 30B has only the depletion layer region 4 and does not have the non-depletion layer region 6. In other words, the minimum diameter D2 of the second columnar portion 30B is equal to the width of the depletion layer region 4 in the radial direction of the second columnar portion 30B. As described above, the second columnar portion 30B has apart where the diameter of the second columnar portion 30B is equal to the width of the depletion layer region 4 in the radial direction of the second columnar portion 30B. Therefore, the second columnar portion 30B can be made to have a high resistance. As a result, no current is injected into the MQW layer 34 of the second columnar portion 30B, and no light emission occurs. In other words, the MQW layer 34 of the second columnar portion 30B does not function as a light emitting layer. Hereinafter, the reason why the second columnar portion 30B has a high resistance will be described.

Figure 5:
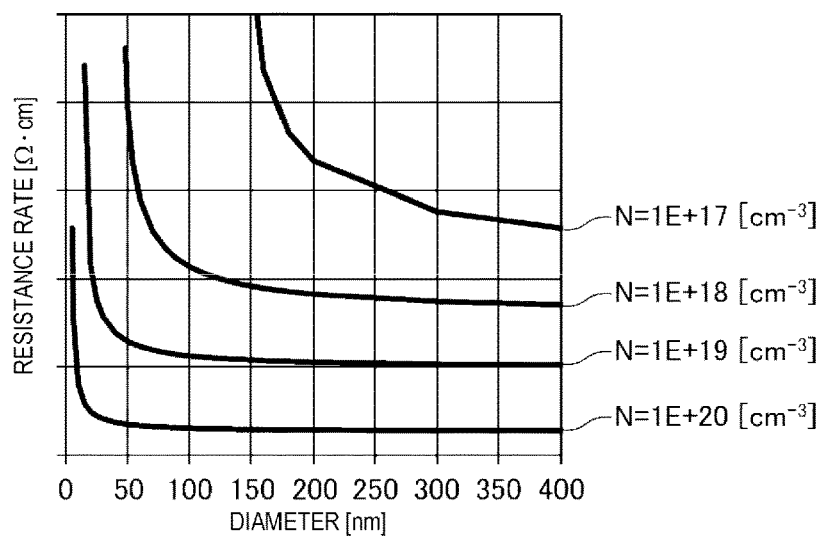
FIG. 5 is a graph illustrating a relationship between a diameter of a first semiconductor layer and a resistance of the first semiconductor layer.

FIG. 5 is a graph illustrating a relationship between a diameter of the first semiconductor layer and a resistance of the first semiconductor layer. In FIG. 5, the material of the first semiconductor layer is calculated as GaN doped with silicon.

As illustrated in FIG. 5, it can be seen that the resistance increases rapidly as the diameter of the first semiconductor layer that configures the columnar portion is reduced. In general, the resistance is inversely proportional to the cross-sectional area of the first semiconductor layer, and when the cross-sectional area is halved, the resistance is doubled. However, as illustrated in FIG. 4, when the diameter of the first semiconductor layer becomes equal to the width of the depletion layer region, the above-described correlation is lost and the resistance increases rapidly. Therefore, the columnar portion can be made high resistance. In addition, the cross-sectional area of the first semiconductor layer 32 is an area of a cross section cut along a plane having a normal line parallel to the lamination direction.

For example, the resistance in the lamination direction of the first semiconductor layer 32 of the first columnar portion 30A and the resistance in the lamination direction of the first semiconductor layer 32 of the second columnar portion 30B are measured. As a result of the measurement, when the correlation between the cross-sectional area and the resistance is lost, it can be determined that the second columnar portion 30B has a part at which the diameter of the second columnar portion 30B is equal to the width of the depletion layer region 4 in the radial direction of the second columnar portion 30B.

As illustrated in FIG. 5, the resistance of the columnar portion also depends on the carrier concentration. For example, when the carrier concentration is $1 \times 10^{18}$ cm$^{-3}$, the diameter of the first semiconductor layer 32 is 60 nm or less, and the diameter of the first semiconductor layer 32 is the width of the depletion layer region 4.

The composition of indium in the MQW layer 34 of the second columnar portion 30B is lower than the concentration of indium in the MQW layer 34 of the first columnar portion 30A. Therefore, a wavelength of light generated in the MQW layer 34 of the first columnar portion 30A and a wavelength of light absorbed by the MQW layer 34 of the second columnar portion 30B can be shifted.

The light propagation layer 40 is provided between the first columnar portions 30A and the second columnar portions 30B which are adjacent to each other, between the first columnar portions 30A adjacent to each other, and between the second columnar portions 30B adjacent to each other. The light propagation layer 40 is provided on the mask layer 60. The light propagation layer 40 covers the side surface of the first columnar portion 30A and the side surface of the second columnar portion 30B. A refractive index of the light propagation layer 40 is lower than a refractive index of the first columnar portion 30A and the refractive index of the second columnar portion 30B. The light propagation layer 40 is, for example, a GaN layer that is not doped with impurities. The light generated in the MQW layer 34 of the first columnar portion 30A can propagate through the light propagation layer 40 in a direction orthogonal to the lamination direction. The light propagation layer 40 is not limited to a GaN layer, and may be another insulating layer, such as an AlGaN layer or a silicon oxide layer.

The first electrode 50 is provided on the buffer layer 22. The buffer layer 22 may be in ohmic contact with the first electrode 50. The first electrode 50 is electrically coupled to the first semiconductor layer 32. In the illustrated example, the first electrode 50 is electrically coupled to the first semiconductor layer 32 via the buffer layer 22. The first electrode 50 is one electrode for injecting a current into the MQW layer 34. As the first electrode 50, a member configured by laminating a Ti layer, an Al layer, and an Au layer in order from the buffer layer 22 side is used, for example. In a case where the substrate 10 is conductive, the first electrode 50 may be provided under the substrate 10 although not illustrated.

The second electrode 52 is provided on the side opposite to base 10 side of the laminated structure 20. In the illustrated example, the second electrode 52 is provided on the second semiconductor layer 36. The second semiconductor layer 36 may be in ohmic contact with the second electrode 52. The second electrode 52 is electrically coupled to the second semiconductor layer 36. The second electrode 52 is the other electrode for injecting a current into the MQW layer 34. As the second electrode 52, for example, indium tin oxide (ITO) is used.

As illustrated in FIG. 2, the laminated structure 20 includes a plurality of columnar portion groups 2. The columnar portion groups 2 are periodically arranged. For example, the columnar portion groups 2 are arranged at a pitch of approximately 250 nm. In the illustrated example, the plurality of columnar portion groups 2 are arranged in a triangular lattice shape in a plan view from the lamination direction. The arrangement of the plurality of columnar portion groups 2 is not limited to a triangular lattice shape, and may be arranged in a square lattice shape, for example. The plurality of columnar portion groups 2 can exhibit the effect of a photonic crystal. For example, the plurality of columnar portion groups 2 can exhibit an optical confinement effect due to the photonic band edge in visible light.

The columnar portion group 2 includes a plurality of first columnar portions 30A and a plurality of second columnar portions 30B. In the example illustrated in FIG. 2, the columnar portion group 2 includes two first columnar portions 30A and two second columnar portions 30B. A direction in which the two first columnar portions 30A are arranged and a direction in which the two second columnar portions 30B are arranged are, for example, orthogonal to each other.

Figure 8:
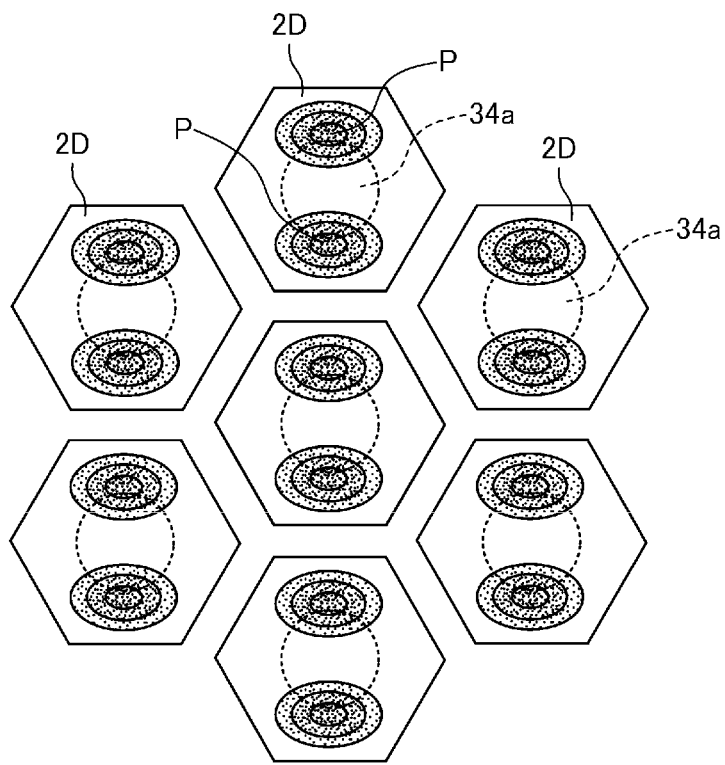
FIG. 8 is a plan view schematically illustrating a columnar portion of a light emitting device according to a reference example.

In the light emitting device 100, the columnar portion groups 2 configured with the plurality of first columnar portions 30A and the plurality of second columnar portions 30B are regarded as one nanostructure and are periodically arranged. Accordingly, for example, as illustrated in FIG. 8 to be described later, the diameters of the first columnar portion 30A and the second columnar portion 30B can be reduced compared to a case where one nanostructure is configured with one columnar portion. As a result, strain inherent in the MQW layer 34 can be reduced, and light can be amplified with high efficiency.

The light generated in the MQW layer 34 of the first columnar portion 30A propagates through the light propagation layer 40 in the direction orthogonal to the lamination direction by the first semiconductor layer 32 and the second semiconductor layer 36, a standing wave is formed by the effect of the photonic crystal by the plurality of columnar portion groups 2, and laser oscillation occurs by receiving a gain in the MQW layer 34 of the first columnar portion 30A. Then, the light emitting device 100 emits +first order diffracted light and −first order diffracted light as laser light in the lamination direction.

Figure 6:
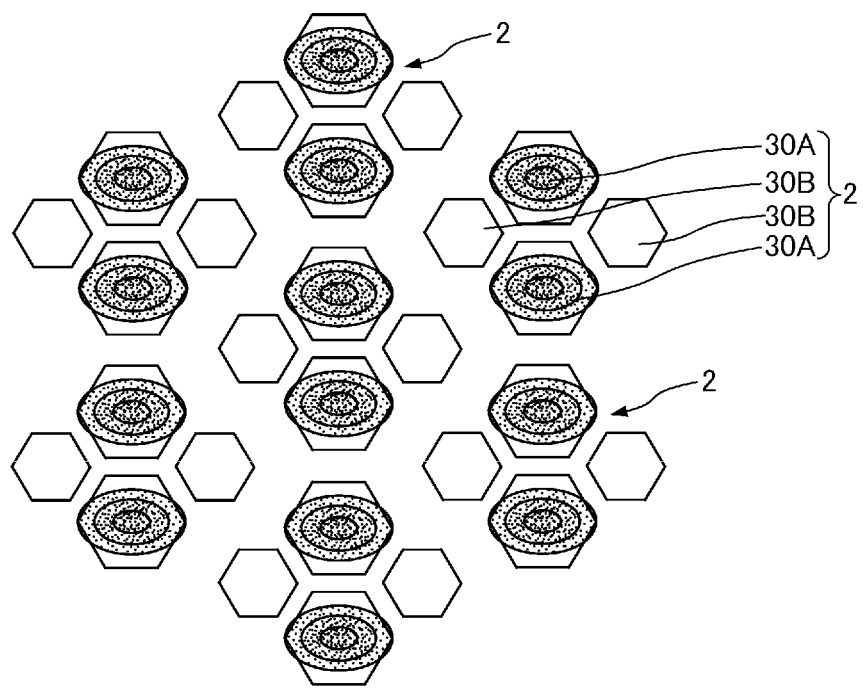
FIG. 6 is a view schematically illustrating an example of an electric field intensity distribution in an optical confinement mode.
Figure 7:
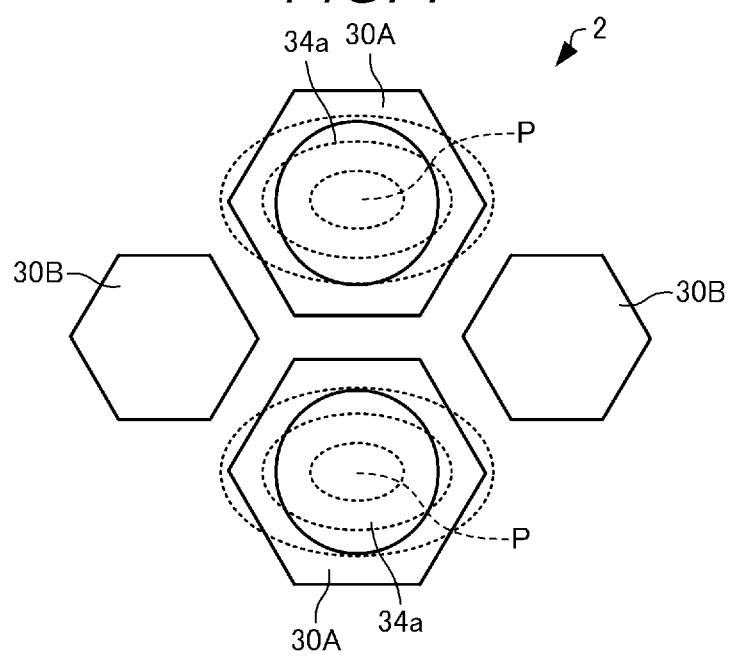
FIG. 7 is a view schematically illustrating an example of the electric field intensity distribution in the optical confinement mode.

FIGS. 6 and 7 are views schematically illustrating an example of an electric field intensity distribution in an optical confinement mode formed by the columnar portion group 2. FIG. 6 illustrates the isointensity lines that couple the positions where the electric field intensities are equal by solid lines. FIG. 7 illustrates the isointensity lines indicated by broken lines. FIG. 7 illustrates one enlarged columnar portion group 2.

In the light emitting device 100, as illustrated in FIG. 6, the optical confinement mode is formed in the plurality of columnar portion groups 2. In other words, in the light emitting device 100, the electric field intensity distribution is formed in the plurality of columnar portion groups 2. In the plurality of columnar portion groups 2, a plurality of modes having different wavelengths and electric field distributions are formed simultaneously. For example, in a photonic crystal in which the plurality of columnar portion groups 2 are two-dimensionally arranged in a triangular lattice shape, when lasing at a photonic band edge is used, a plurality of modes having different wavelengths and electric field distributions are formed simultaneously. As a typical mode among the plurality of modes formed in this manner, FIGS. 6 and 7 illustrate a mode having two peaks P of electric field intensity with respect to one columnar portion group 2. The optical confinement mode can be controlled by, for example, the arrangement of the plurality of columnar portion groups 2. The optical confinement mode can be obtained by using, for example, a plane wave expansion method (PWE method). The optical confinement mode is expressed as a standing wave formed by the effect of the photonic crystal described above. The position of the peak P of electric field intensity is a position where the electric field intensity changes most largely in the standing wave, and is a position where the electric field intensity takes an extreme value.

Here, the MQW layer 34 of the first columnar portion 30A functions as a light emitting layer that generates light when a current is injected, no current is injected into the MQW layer 34 of the second columnar portion 30B, and the MQW layer 34 of the second columnar portion 30B does not function as a light emitting layer. In other words, in the light emitting device 100, the first columnar port ion 30A is an active columnar portion to which a current is injected to generate light, and the second columnar portion 30B is an inactive columnar portion to which no current is injected not to cause light emission or absorption.

The first columnar portion 30A is disposed at a position that overlaps the peak P of electric field intensity. The second columnar portion 30B is disposed at a position that does not overlap the peak P. In other words, the electric field intensity in the first columnar portion 30A is larger than the electric field intensity in the second columnar portion 30B. In the first columnar portion 30A, as illustrated in FIG. 7, the first part 34a of the MQW layer 34 is disposed at a position that overlaps the peak P. The second part 34b of the MQW layer 34 of the first columnar portion 30A does not overlap the peak P. In other words, in the first columnar portion 30A, the electric field intensity at the first part 34a is larger than the electric field intensity at the second part 34b.

In one columnar portion group 2, the number of first columnar portions 30A and the number of peaks P are equal. In the example illustrated in FIGS. 6 and 7, in one columnar portion group 2, the number of first columnar portions 30A is two and the number of peaks P is two.

In the light emitting device 100, in the first columnar portion 30A, the p-type second semiconductor layer 36, the MQW layer 34, and the n-type first semiconductor layer 32 configure a pin diode. In the light emitting device 100, when a forward bias voltage of the pin diode is applied between the first electrode 50 and the second electrode 52, a current is injected into the MQW layer 34 of the first columnar portion 30A, and recombination of an electron and a positive hole occurs on the MQW layer 34. The recombination causes light emission. Since the second columnar portion 30B has a high resistance, no current is injected into the MQW layer 34 of the second columnar portion 30B even when a voltage is applied between the first electrode 50 and the second electrode 52, and the light emission does not occur.

Although not illustrated, a reflective layer may be provided between the substrate 10 and the buffer layer 22 or below the substrate 10. The reflective layer is, for example, a distributed bragg reflector (DBR) layer. The light generated in the MQW layer 34 can be reflected by the reflective layer, and the light emitting device 100 can emit light only from the second electrode 52 side.

For example, the light emitting device 100 has the following characteristics.

In the light emitting device 100, the first columnar portion 30A is disposed at a position that overlaps the peak P of electric field intensity, and the second columnar portion 30B is disposed at a position that does not overlap the peak P of electric field intensity. Therefore, in the in-plane direction, the position of the MQW layer 34 of the first columnar portion 30A that functions as the light emitting layer and the position of the peak P of electric field intensity can match each other. Therefore, the coupling between the light emitting layer and the electric field can be strengthened, and a gain can be selectively generated at the position of the peak P of electric field intensity. Accordingly, the light can be amplified with high efficiency and the lasing threshold value can be reduced.

Furthermore, in the light emitting device 100, the columnar portion group 2 configured with the plurality of first columnar portions 30A and the plurality of second columnar portions 30B is regarded as one nanostructure, and accordingly, the diameters of the first columnar portion 30A and the second columnar portion 30B can be reduced. Therefore, the strain inherent in the MQW layer 34 can be reduced. Accordingly, the light can be amplified with high efficiency and the lasing threshold value can be reduced.

In the light emitting device 100, in the first columnar portion 30A that functions as a light emitting layer, the first part 34a of the MQW layer 34 is disposed at a position that overlaps the peak P of electric field intensity. Therefore, the coupling between the first part 34a that functions as a quantum well layer and the electric field can be strengthened. Accordingly, the light can be amplified with high efficiency and the lasing threshold value can be reduced.

The effects of the above-described light emitting device 100 will be described with reference examples. FIG. 8 is a plan view schematically illustrating a columnar portion 2D of a light emitting device according to a reference example. In addition, one columnar portion 2D illustrated in FIG. 8 corresponds to the columnar portion group 2 of the light emitting device 100.

In a case where a mode having two peaks P of electric field intensity is formed for one columnar portion 2D, the first part 34a that functions as a quantum well layer and the peak P do not overlap each other. Therefore, in the light emitting device according to the reference example, the coupling between the first part 34a and the electric field is weak, and the light cannot be amplified efficiently.

On the other hand, as illustrated in FIG. 7, the light emitting device 100 includes a columnar portion group 2 having a plurality of first columnar portions 30A and a plurality of second columnar portions 30B. Therefore, the two peaks P of electric field intensity and the first parts 34a of the MQW layers 34 of the two first columnar portions 30A can overlap each other. Therefore, as described above, the light emitting device 100 can amplify light with high efficiency and reduce the lasing threshold value. Moreover, in the light emitting device 100, by having the second columnar portion 30B, compared to the reference example, a filling factor of the columnar portion does not fall largely.

Furthermore, in the light emitting device 100, the first part 34a and the peak P are strongly coupled to each other in the mode having two peaks P of electric field intensity with respect to one columnar portion group 2. On the other hand, in the other modes, since the position of the peak P changes, the first part 34a and the peak P cannot be strongly coupled to each other. Therefore, in the light emitting device 100, it is possible to reduce the possibility that modes other than the optical confinement mode illustrated in FIGS. 6 and 7 compete with each other.

In the light emitting device 100, the diameter of the second columnar portion 30B is smaller than the diameter of the first columnar portion 30A. Here, in the step of crystal growth of the MQW layer 34, the indium composition of the MQW layer 34 decreases as the diameter of the columnar portion decreases. Therefore, in the light emitting device 100, the composition of indium in the second columnar portion 30B is lower than the concentration of indium in the first columnar portion 30A. Therefore, the wavelength of light generated in the MQW layer 34 of the first columnar portion 30A and the wavelength of light absorbed by the MQW layer 34 of the second columnar portion 30B can be shifted. Accordingly, in the light emitting device 100, the amount of light absorbed by the second columnar portion 30B can be reduced.

In the light emitting device 100, the second columnar portion 30B has a part where the diameter of the second columnar portion 30B is equal to the width of the depletion layer region 4 in the radial direction of the second columnar portion 30B. Therefore, as described above, the second columnar portion 30B can be made to have a high resistance. Accordingly, no current is injected into the MQW layer 34 of the second columnar portion 30B even when a voltage is applied between the first electrode 50 and the second electrode 52, and the light emission does not occur in the MQW layer 34.

In the light emitting device 100, the number of peaks P of electric field intensity in the columnar portion group 2 is equal to the number of first columnar portions 30A. Therefore, in the light emitting device 100, the position of the light emitting layer and the electric field intensity distribution can match each other in the in-plane direction, and the light can be amplified with high efficiency.

1.2. Manufacturing Method of Light Emitting Device

Figure 9:
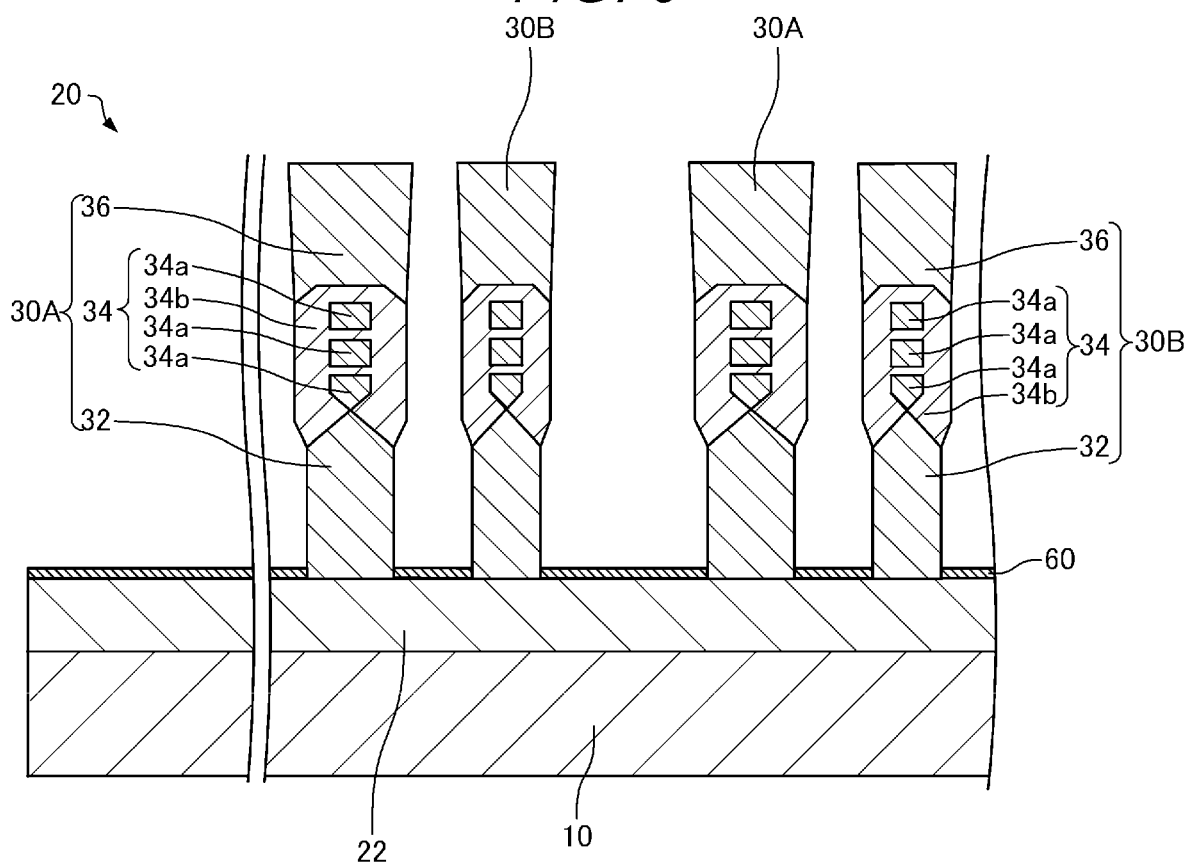
FIG. 9 is a sectional view schematically illustrating a manufacturing process of the light emitting device according to the first embodiment.

Next, a manufacturing method of the light emitting device 100 according to the first embodiment will be described with reference to the drawings. FIG. 9 is a sectional view schematically illustrating a manufacturing process of the light emitting device 100 according to the first embodiment.

As illustrated in FIG. 9, the buffer layer 22 is epitaxially grown on the substrate 10. Examples of the epitaxial growth method include a metal organic chemical vapor deposition (MOCVD) method, a molecular beam epitaxy (MBE) method, and the like.

Next, the mask layer 60 is formed on the buffer layer 22. The mask layer 60 is formed by, for example, film formation by an electron beam vapor deposition method or a plasma chemical vapor deposition (CVD) method, and patterning by a photolithography technique and an etching technique. An area of the opening for forming the second columnar portion 30B of the mask layer 60 is smaller than an area of the opening for forming the first columnar portion 30A of the mask layer 60. Accordingly, the diameter of the second columnar portion 30B can be made smaller than the diameter of the first columnar portion 30A.

Next, the first semiconductor layer 32, the MQW layer 34, and the second semiconductor layer 36 are epitaxially grown on the buffer layer 22 using the mask layer 60 as a mask. Examples of the epitaxial growth method include an MOCVD method and an MBE method.

Here, when the MQW layer 34 is epitaxially grown, the first part 34a and the second part 34b are formed by migration of indium. Further, by growing the crystal such that the diameter of the second columnar portion 30B is smaller than the diameter of the first columnar portion 30A, the composition of indium in the MQW layer 34 of the second columnar portion 30B can be reduced to be lower than the composition of the indium of the MQW layer 34 of the first columnar portion 30A.

Through the above steps, the columnar portion group 2 having the plurality of first columnar portions 30A and the plurality of second columnar portions 30B is formed.

As illustrated in FIG. 1, the light propagation layer 40 is formed on the mask layer 60. The light propagation layer 40 is formed by, for example, the MOCVD method, the spin coating method, or the like.

Next, the first electrode 50 is formed on the buffer layer 22, and the second electrode 52 is formed on the second semiconductor layer 36. The first electrode 50 and the second electrode 52 are formed by, for example, a vacuum evaporation method. An order of forming the first electrode 50 and the second electrode 52 is not particularly limited.

Through the above steps, the light emitting device 100 can be manufactured.

1.3. Modification Example

Next, a modification example of the light emitting device 100 according to the first embodiment will be described. In each modification example described below, members having the same functions as those of the above-described light emitting device 100 will be given the same reference numerals, and the detailed description thereof will be omitted.

1.3.1. First Modification Example

Figure 10:
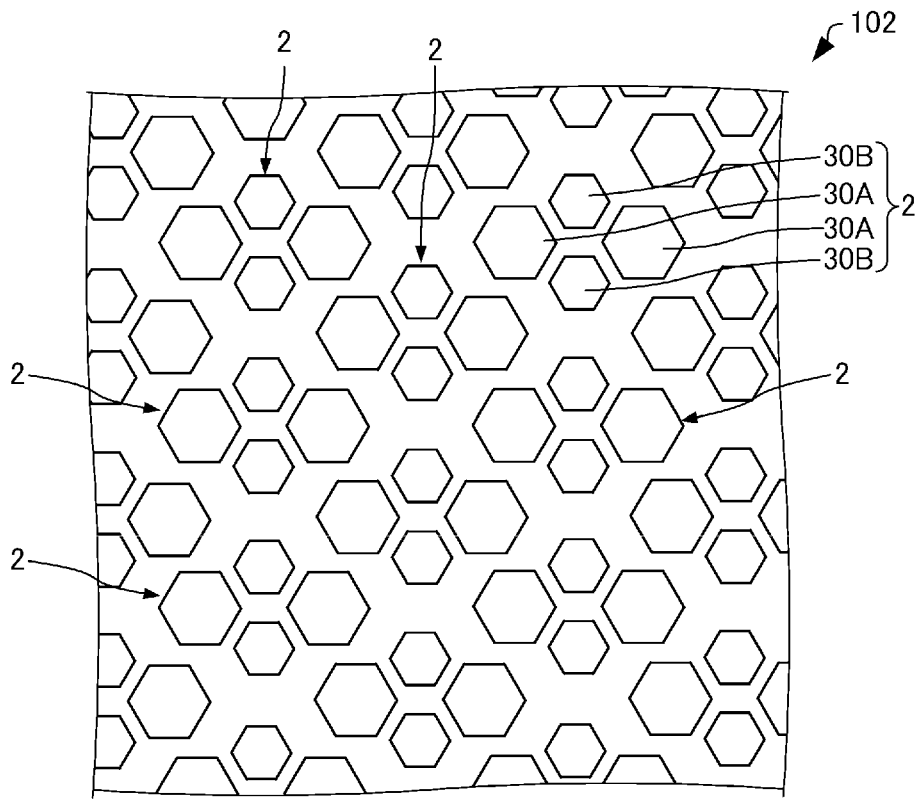
FIG. 10 is a plan view schematically illustrating a light emitting device according to the first modification example.

FIG. 10 is a plan view schematically illustrating the light emitting device according to a first modification example. FIG. 10 corresponds to FIG. 2.

In a light emitting device 102, as illustrated in FIG. 10, the direction in which the two first columnar portions 30A are arranged rotates by 90 degrees with respect to the direction in which the two first columnar portions 30A are arranged in the light emitting device 100 illustrated in FIG. 2 described above. Similarly, the direction in which the two second columnar portions 30B are arranged rotates by 90 degrees with respect to the direction in which the two second columnar portions 30B are arranged in the light emitting device 100 illustrated in FIG. 2 described above.

Figure 11:
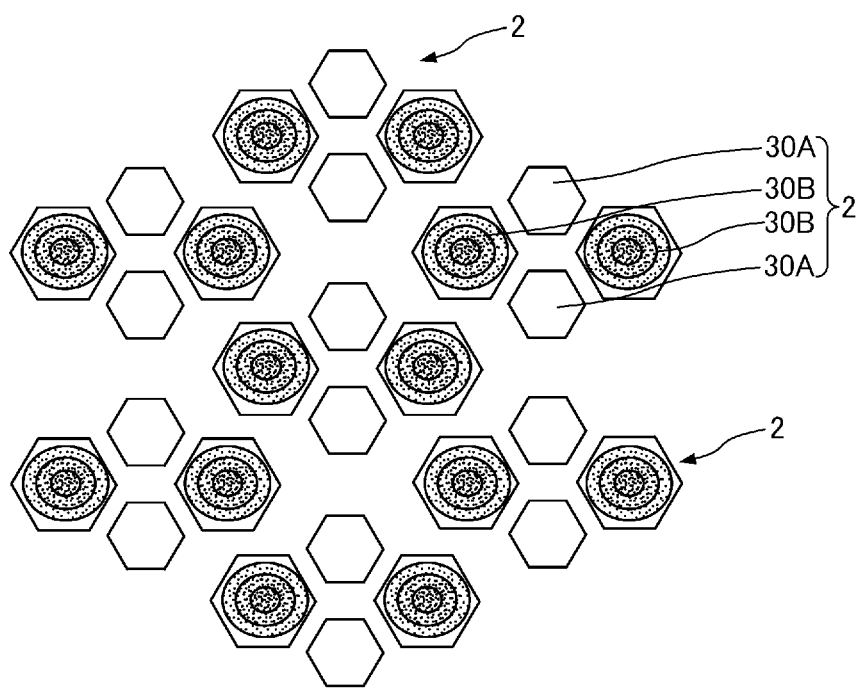
FIG. 11 is a view schematically illustrating an example of the electric field intensity distribution in the optical confinement mode.

FIG. 11 is a view schematically illustrating an example of the electric field intensity distribution in the optical confinement mode.

In the example illustrated in FIG. 11, the optical confinement mode having two peaks of the electric field intensity is illustrated for one columnar portion group 2. The direction in which the two peaks of electric field intensity in the light emitting device 102 are arranged rotates by 90 degrees with respect to the direction in which the two peaks of electric field intensity in the light emitting device 100 illustrated in FIG. 6 are arranged. In the light emitting device 102, the first columnar portion 30A is disposed at a position that overlaps the peak of the electric field intensity in the optical confinement mode illustrated in FIG. 11.

In the light emitting device 102, the first columnar portion 30A is disposed at a position that overlaps the peak of the electric field intensity, and the second columnar portion 30B is disposed at a position that does not overlap the peak P of electric field intensity. Therefore, similar to the light emitting device 100, the light can be amplified with high efficiency, and the lasing threshold value can be reduced.

1.3.2. Second Modification Example

Figure 12:
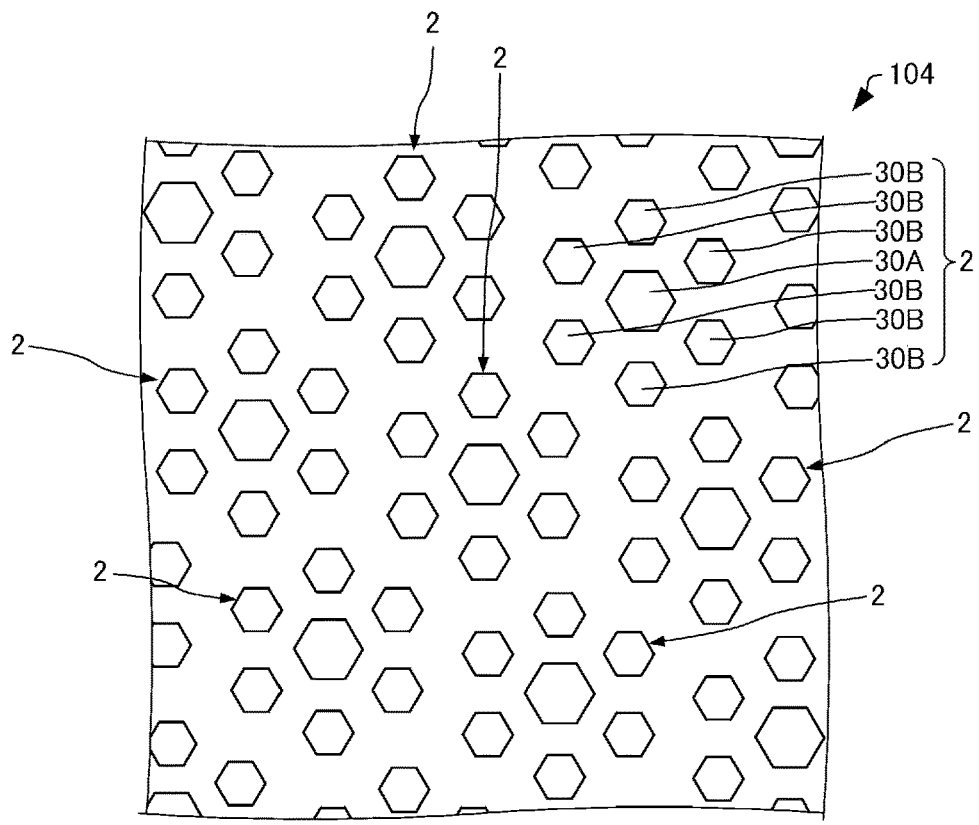
FIG. 12 is a plan view schematically illustrating a light emitting device according to a second modification example.

FIG. 12 is a plan view schematically illustrating the light emitting device according to a second modification example. FIG. 12 corresponds to FIG. 2.

In the above-described light emitting device 100, as illustrated in FIG. 2, the columnar portion group 2 has two first columnar portions 30A and two second columnar portions 30B.

On the other hand, in a light emitting device 104, as illustrated in FIG. 12, the columnar portion group 2 has one first columnar portions 30A and six second columnar portions 30B.

In the example illustrated in FIG. 12, the six second columnar portions 30B are arranged at equal intervals around the first columnar portion 30A.

Figure 13:
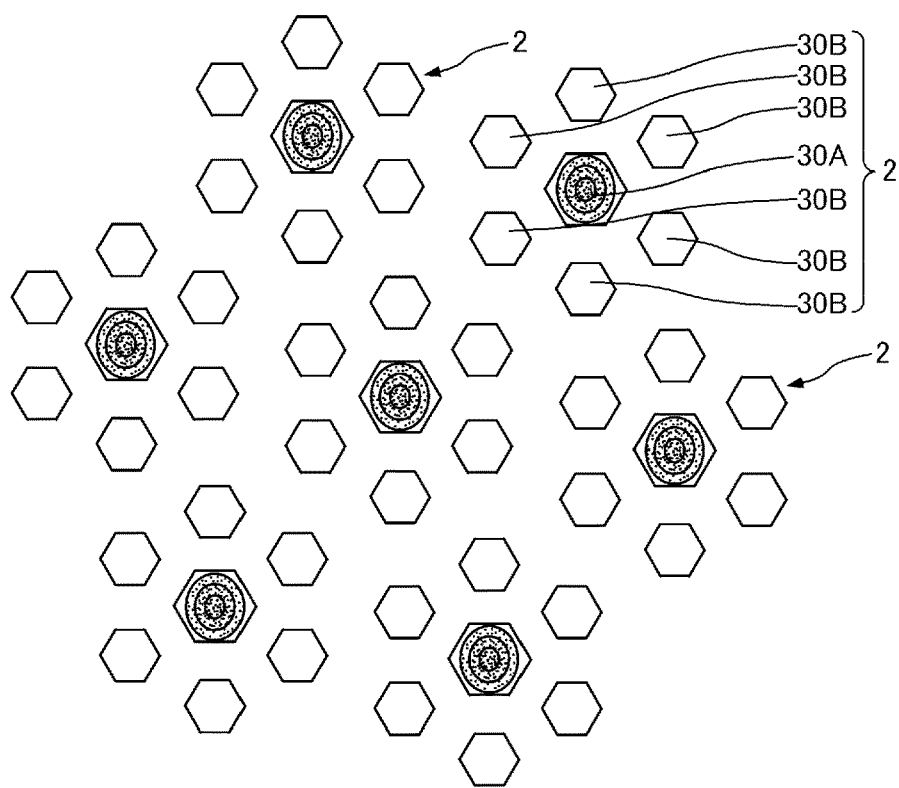
FIG. 13 is a view schematically illustrating an example of the electric field intensity distribution in the optical confinement mode.

FIG. 13 is a view schematically illustrating an example of the electric field intensity distribution in the optical confinement mode.

In the example illustrated in FIG. 13, the optical confinement mode having one peak of the electric field intensity is illustrated for one columnar portion group 2. The first columnar portion 30A is disposed at a position that overlaps the peak.

In the light emitting device 104, the first columnar portion 30A is disposed at a position that overlaps the peak of the electric field intensity, and the second columnar portion 30B is disposed at a position that does not overlap the peak P of electric field intensity. Therefore, similar to the light emitting device 100, the light can be amplified with high efficiency, and the lasing threshold value can be reduced.

As illustrated in the first modification example and the second modification example described above, the number and arrangement of the first columnar portions 30A and the second columnar portions 30B that configure the columnar portion group 2 can be appropriately changed in accordance with the optical confinement mode for combination.

2. Second Embodiment 2.1. Light Emitting Device

Figure 14:
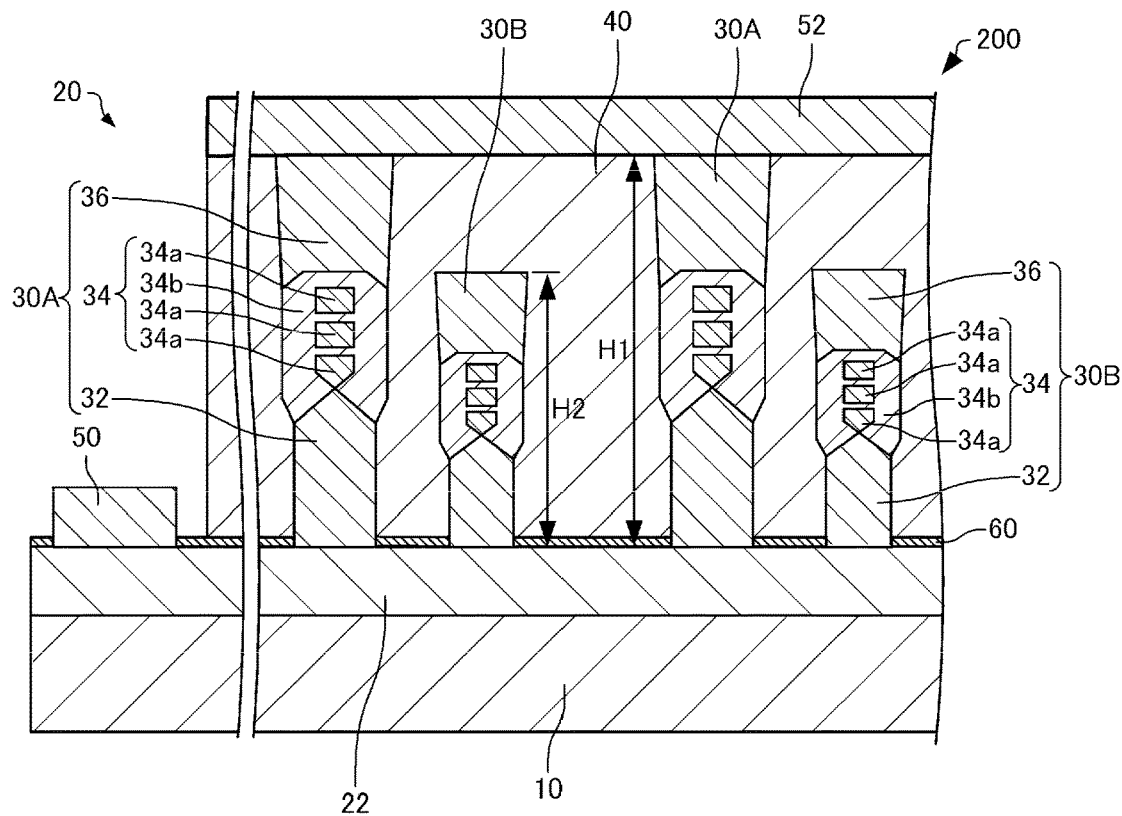
FIG. 14 is a sectional view schematically illustrating a light emitting device according to a second embodiment.

Next, a light emitting device according to a second embodiment will be described with reference to the drawings. FIG. 14 is a sectional view schematically illustrating a light emitting device 200 according to the second embodiment. Hereinafter, in the light emitting device 200 according to the second embodiment, members having the same functions as those of the configuration members of the light emitting device 100 according to the above-described first embodiment will be given the same reference numerals, and the detailed description thereof will be omitted.

In the above-described light emitting device 100, as illustrated in FIG. 1, the second columnar portion 30B is made to have a high resistance by reducing the diameter of the second columnar portion 30B, and no current is injected into the second columnar portion 30B.

On the other hand, in the light emitting device 200, as illustrated in FIG. 14, a height H2 of the second columnar portion 30B is lower than a height H1 of the first columnar portion 30A. Therefore, the second columnar portion 30B is not electrically coupled to the second electrode 52, and no current is injected into the second columnar portion 30B. A difference between the height H1 of the first columnar portion 30A and the height H2 of the second columnar portion 30B is, for example, 10 nm or more.

In addition, the height H1 of the first columnar portion 30A is the size in the lamination direction of the first columnar portion 30A. In addition, the height H2 of the second columnar portion 30B is the size in the lamination direction of the second columnar portion 30B.

The insulating light propagation layer 40 is provided between the second columnar portion 30B and the second electrode 52. Therefore, the second columnar portion 30B and the second electrode 52 can be more reliably insulated. As the light propagation layer 40, for example, an insulating material, such as silicon oxide, can be used.

The composition of indium in the MQW layer 34 of the second columnar portion 30B is lower than the concentration of indium in the MQW layer 34 of the first columnar portion 30A. Therefore, the wavelength of light generated in the MQW layer 34 of the first columnar portion 30A and the wavelength of light absorbed by the MQW layer 34 of the second columnar portion 30B can be shifted. Therefore, the amount of light absorbed by the second columnar portion 30B can be reduced.

The diameter of the second columnar portion 30B is smaller than the diameter of the first columnar portion 30A, for example. As will be described later, the height H2 of the second columnar portion 30B can be set to be lower than the height H1 of the first columnar portion 30A by growing the crystal such that the diameter of the second columnar portion 30B is smaller than the diameter of the first columnar portion 30A. Furthermore, the composition of indium in the MQW layer 34 of the second columnar portion 30B can be lower than the composition of indium in the MQW layer 34 of the first columnar portion 30A.

The height H2 of the second columnar portion 30B is equal to or larger than the sum of a thickness of the first semiconductor layer 32 of the first columnar portion 30A and a thickness of the MQW layer 34 of the first columnar portion 30A. Therefore, for example, compared to a case where the height H1 of the first columnar portion 30A is equal to the height H2 of the second columnar portion 30B, that is, a case where H1=H2, the filling factor of the columnar portion on the upper side of the MQW layer 34 of the first columnar portion 30A can be reduced. Accordingly, an average refractive index on the upper side of the MQW layer 34 of the first columnar portion 30A can be lowered, and the amount of light that leaks from the MQW layer 34 of the first columnar portion 30A to the upper side of the MQW layer 34 can be reduced. As a result, the amount of light absorbed by the second electrode 52 can be reduced, and the lasing threshold value can be reduced.

In the light emitting device 200, the first columnar portion 30A is disposed at a position that overlaps the peak P of electric field intensity, and the second columnar portion 30B is disposed at a position that does not overlap the peak P of electric field intensity. Therefore, similar to the light emitting device 100, the light can be amplified with high efficiency, and the lasing threshold value can be reduced.

Furthermore, in the light emitting device 200, the height H2 of the second columnar portion 30B is lower than the height H1 of the first columnar portion 30A. Therefore, no current is injected into the MQW layer 34 of the second columnar portion 30B even when a voltage is applied between the first electrode 50 and the second electrode 52, and the light emission does not occur in the MQW layer 34 of the second columnar portion 30B.

By reducing the height H2 of the second columnar portion 30B such that no current is injected into the second columnar portion 30B, a degree of freedom in the diameter of the second columnar portion 30B increases. For example, in the light emitting device 100, the diameter of the second columnar portion 30B is limited since the diameter of the second columnar portion 30B is reduced such that no current is injected into the second columnar portion 30B. On the other hand, in the light emitting device 200, since the height H2 of the second columnar portion 30B is reduced such that no current is injected into the second columnar portion 30B, compared to the example of the light emitting device 100, a degree of freedom in the diameter of the second columnar portion 30B is large.

2.2. Manufacturing Method of Light Emitting Device

Figure 15:
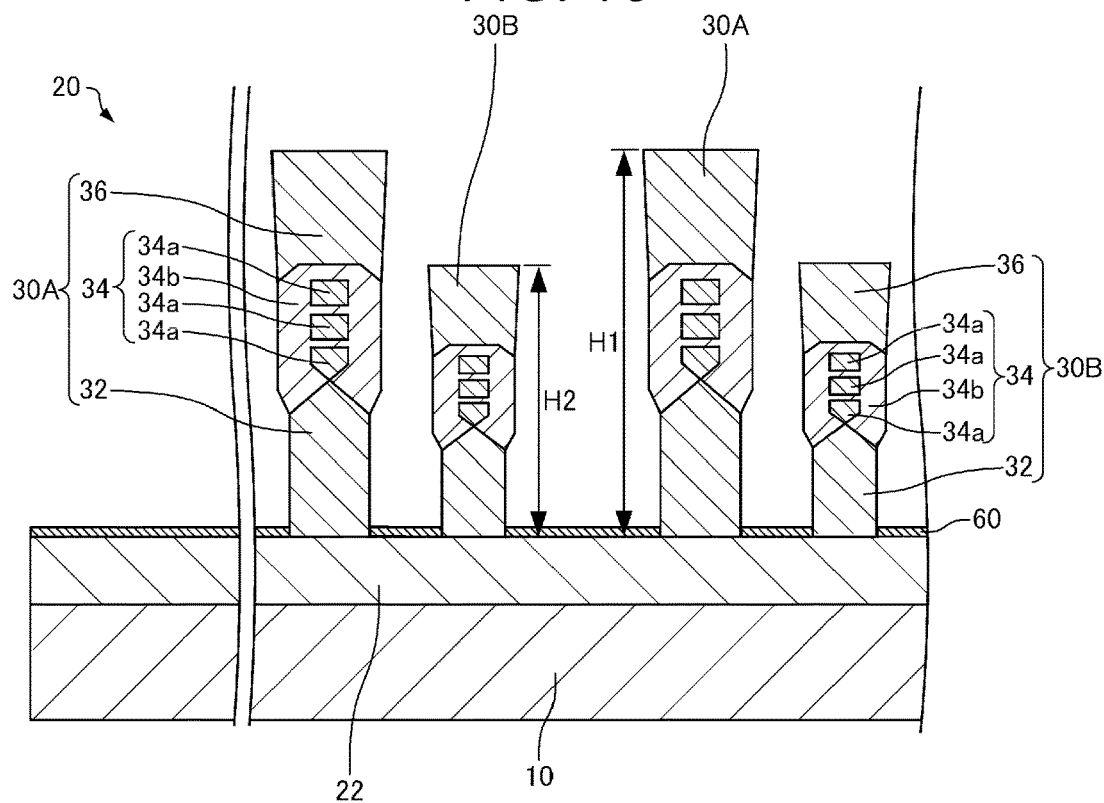
FIG. 15 is a sectional view schematically illustrating a manufacturing process of the light emitting device according to the second embodiment.

Next, a manufacturing method of the light emitting device 200 according to the second embodiment will be described with reference to the drawings. FIG. 15 is a sectional view schematically illustrating a manufacturing process of the light emitting device 200 according to the second embodiment. Hereinafter, a difference from the above-described manufacturing method of the light emitting device 100 will be described, and the description of the same parts will be omitted.

As illustrated in FIG. 15, the buffer layer 22 is epitaxially grown on the substrate 10. Next, the mask layer 60 is formed on the buffer layer 22.

An area of the opening for forming the second columnar portion 30B of the mask layer 60 is smaller than an area of the opening for forming the first columnar portion 30A of the mask layer 60. Accordingly, the diameter of the second columnar portion 30B can be made smaller than the diameter of the first columnar portion 30A.

Next, the first semiconductor layer 32, the MQW layer 34, and the second semiconductor layer 36 are epitaxially grown on the buffer layer 22 using the mask layer 60 as a mask.

The height H2 of the second columnar portion 30B can be set to be lower than the height H1 of the first columnar portion 30A by growing the crystal such that the diameter of the second columnar portion 30B is smaller than the diameter of the first columnar portion 30A. Further, by growing the crystal such that the diameter of the second columnar portion 30B is smaller than the diameter of the first columnar portion 30A, the composition of indium in the MQW layer 34 of the second columnar portion 30B can be reduced to be lower than the composition of the indium of the MQW layer 34 of the first columnar portion 30A.

Through the above steps, the columnar portion group 2 having the plurality of first columnar portions 30A and the plurality of second columnar portions 30B is formed.

As illustrated in FIG. 14, the light propagation layer 40 is formed on the mask layer 60. Next, the first electrode 50 is formed on the buffer layer 22, and the second electrode 52 is formed on the second semiconductor layer 36.

Through the above steps, the light emitting device 200 can be manufactured.

2.3. Modification Example

The first modification example and the second modification example of the light emitting device according to the above-described first embodiment can also be applied to the light emitting device according to the second embodiment.

3. Third Embodiment

Figure 16:
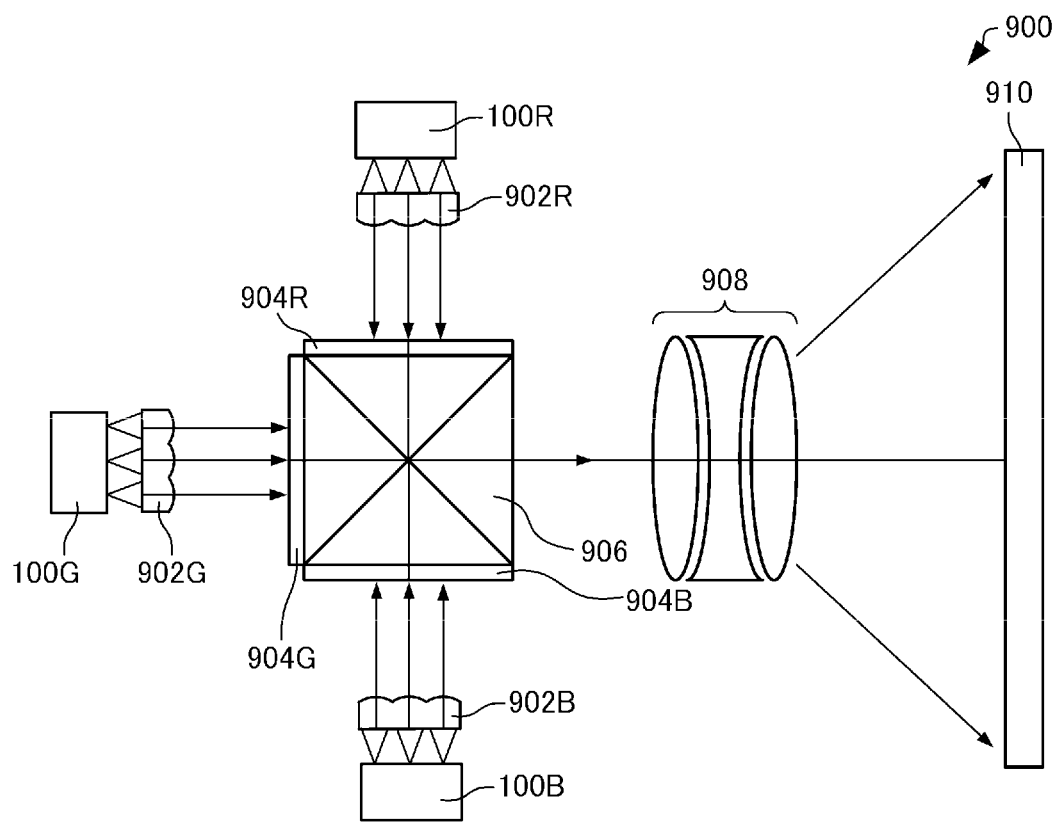
FIG. 16 is a sectional view schematically illustrating a projector according to a third embodiment.

Next, a projector according to a third embodiment will be described with reference to the drawings. FIG. 16 is a view schematically illustrating a projector 900 according to the third embodiment.

The projector 900 includes the light emitting device 100 as a light source, for example.

The projector 900 includes a housing (not illustrated) and a red light source 100R, a green light source 100G, and a blue light source 100B that are provided in the housing and respectively emit red light, green light, and blue light. For convenience, in FIG. 16, the red light source 100R, the green light source 100G, and the blue light source 100B are simplified.

The projector 900 further includes a first lens array 902R, a second lens array 902G, a third lens array 902B, a first light modulation device 904R, a second light modulation device 904G, a third light modulation device 904B, and a projection device 908 that are provided in the housing. The first light modulation device 904R, the second light modulation device 904G, and the third light modulation device 904B are, for example, transmissive liquid crystal light valves. The projection device 908 is, for example, a projection lens.

The light emitted from the red light source 100R is incident on the first lens array 902R. The light emitted from the red light source 100R can be condensed by the first lens array 902R, for example, superimposed.

The light condensed by the first lens array 902R is incident on the first light modulation device 904R. The first light modulation device 904R modulates the incident light in accordance with image information. Then, the projection device 908 enlarges and projects the image formed by the first light modulation device 904R onto a screen 910.

The light emitted from the green light source 100G is incident on the second lens array 902G. The light emitted from the green light source 100G can be condensed by the second lens array 902G, for example, superimposed.

The light condensed by the second lens array 902G is incident on the second light modulation device 904G. The second light modulation device 904G modulates the incident light in accordance with image information. Then, the projection device 908 enlarges and projects the image formed by the second light modulation device 904G onto the screen 910.

The light emitted from the blue light source 100B is incident on the third lens array 902B. The light emitted from the blue light source 100B can be condensed by the third lens array 902B, for example, superimposed.

The light condensed by the third lens array 902B is incident on the third light modulation device 904B. The third light modulation device 904B modulates the incident light in accordance with image information. Then, the projection device 908 enlarges and projects the image formed by the third light modulation device 904B onto the screen 910.

Further, the projector 900 can include a cross dichroic prism 906 that combines the light emitted from the first light modulation device 904R, the second light modulation device 904G, and the third light modulation device 904B and guides the light to the projection device 908.

The three rays of color light modulated by the first light modulation device 904R, the second light modulation device 904G, and the third light modulation device 904B are incident on the cross dichroic prism 906. The cross dichroic prism 906 is formed by bonding four right angle prisms, and a dielectric multilayer film that reflects red light and a dielectric multilayer film that reflects blue light are arranged in a cross shape on the inner surface thereof. The dielectric multilayer films combine the three rays of color light to form light that represents a color image. The combined light is projected onto the screen 910 by the projection device 908, and an enlarged image is displayed.

In addition, the red light source 100R, the green light source 100G, and the blue light source 100B control the light emitting device 100 as video pixels in accordance with image information, and accordingly, a video may be directly formed without using the first light modulation device 904R, the second light modulation device 904G, and the third light modulation device 904B. Then, the projection device 908 may enlarge and project the video formed by the red light source 100R, the green light source 100G, and the blue light source 100B onto the screen 910.

In the above-described example, a transmissive liquid crystal light valve is used as the light modulation device, but a light valve other than liquid crystal may be used, or a reflective light valve may be used. Examples of such a light valve include a reflective liquid crystal light valve and a digital micro mirror device. Further, the configuration of the projection device is appropriately changed depending on the type of light valve used.

Further, the light source can also be applied to the light source device of the scanning type image display device including scanning means which is an image forming device for displaying an image of a desired size on a display surface by scanning the light from the light source on the screen.

The light emitting device according to the above-described embodiment can be used in addition to the projector. Applications other than the projector include light sources, such as indoor/outdoor lighting, display backlights, laser printers, scanners, in-vehicle lights, sensing devices using light, and communication devices.

In addition, the present disclosure is not limited to above-described embodiments, various modifications are possible within the range of the summary of the present disclosure.

For example, in the light emitting device 100 according to the above-described first embodiment, the InGaN-based MQW layer 34 has been described, but various material systems that can emit light when a current is injected in accordance with the wavelength of the emitted light can be used as the MQW layer 34. For example, semiconductor materials, such as AlGaN, AlGaAs, InGaAs, InGaAsP, InP, GaP, and AlGaP, can be used. The same applies to the light emitting device 200 according to the second embodiment, and various material systems that can emit light when a current is injected can be used as the MQW layer 34 in accordance with the wavelength of emitted light.

In the present disclosure, a part of the configuration may be omitted within a range having the characteristics and effects described in the application, or each embodiment or modification examples may be combined.

The present disclosure is not limited to the above-described embodiments, and various modifications can be made. For example, the present disclosure includes substantially the same configuration as that described in the embodiments. The substantially same configuration is, for example, a configuration having the same function, method, and result, or a configuration having the same purpose and effect. In addition, the present disclosure includes a configuration in which a non-essential part of the configuration described in the embodiments is replaced. In addition, the present disclosure includes a configuration that exhibits the same operational effects as those of the configuration described in the embodiment or a configuration that can achieve the same purpose. In addition, the present disclosure includes a configuration in which a known technique is added to the configuration described in the embodiments.

What is claimed is:

1. A light emitting device comprising:
   a substrate; and
   a laminated structure provided on the substrate and having a plurality of columnar portion groups, wherein
   the plurality of columnar portion groups form an optical confinement mode which has an electric field intensity distribution,
   each of the columnar portion groups includes
     at least one first columnar portion, and
     a plurality of second columnar portions,
   the at least one first columnar portion has a light emitting layer into which a current is injected to generate light,
   no current is injected into the plurality of second columnar portions,
   the at least one first columnar portion is disposed at a position that overlaps a peak of the electric field intensity distribution in the optical confinement mode,
   the plurality of second columnar portions are respectively disposed at positions that do not overlap the peak of the electric field intensity distribution in the optical confinement mode, and
   each second columnar portion includes a part at which the diameter of the second columnar portion is equal to a width of a depletion layer region in a radial direction of the second columnar portion.

2. The light emitting device according to claim 1, wherein a diameter of the second columnar portion is smaller than a diameter of the first columnar portion.

3. The light emitting device according to claim 1, wherein a height of the second columnar portion is lower than a height of the first columnar portion.

4. The light emitting device according to claim 1, wherein the number of peaks of electric field intensity in the columnar portion group is equal to the number of the first columnar portions.

5. The light emitting device according to claim 1, wherein the columnar portion group includes two first columnar portions and two second columnar portions.

6. The light emitting device according to claim 1, wherein the light emitting layer has a first part and a second part that surrounds the first part,
a band gap of the second part is larger than a band gap of the first part, and
the first part is disposed at a position that overlaps the peak of the electric field intensity.

7. A projector comprising:
the light emitting device according to claim 1.

8. A light emitting device comprising:
a substrate; and
a laminated structure provided on the substrate and having a plurality of columnar portion groups, wherein
each of the columnar portion groups includes
at least one first columnar portion, and
a plurality of second columnar portions,
the at least one first columnar portion has a light emitting layer into which a current is injected to generate light,
no current is injected into the plurality of second columnar portions,
an optical confinement mode is formed in the plurality of columnar portion groups,
the at least one first columnar portion is disposed at a position that overlaps a peak of electric field intensity,
the plurality of second columnar portions are respectively disposed at positions that do not overlap the peak of electric field intensity,
a diameter of each second columnar portion is smaller than a diameter of the at least one first columnar portion, and
each second columnar portion includes a part at which the diameter of the second columnar portion is equal to a width of a depletion layer region in a radial direction of the second columnar portion.

* * * * *